United States Patent
Mitsui et al.

(10) Patent No.: US 7,075,621 B2
(45) Date of Patent: Jul. 11, 2006

(54) ALIGNMENT METHOD

(75) Inventors: Soichiro Mitsui, Kawasaki (JP); Toru Tojo, Naka-gun (JP); Kiminobu Akeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/012,257

(22) Filed: Dec. 16, 2004

(65) Prior Publication Data

US 2005/0128451 A1    Jun. 16, 2005

Related U.S. Application Data

(63) Continuation of application No. 10/397,288, filed on Mar. 27, 2003, now Pat. No. 6,901,314.

(30) Foreign Application Priority Data

Mar. 27, 2002    (JP)    ............................. 2002-089780

(51) Int. Cl.
*G03B 27/42* (2006.01)
*G03B 27/32* (2006.01)

(52) U.S. Cl. ......................................... 355/53; 355/77

(58) Field of Classification Search ............... 355/53, 355/55, 67–77; 414/935; 250/548; 356/399–401; 700/245

See application file for complete search history.

(56) References Cited

U.S. PATENT DOCUMENTS

| | | | |
|---|---|---|---|
| 4,920,385 A | 4/1990 | Clarke et al. | |
| 5,152,055 A | 10/1992 | L'Esperance et al. | |
| 5,199,448 A | 4/1993 | Parker | |
| 5,559,727 A | 9/1996 | Deley et al. | |
| 5,737,441 A * | 4/1998 | Nishi | 382/151 |
| 6,275,748 B1 | 8/2001 | Bacchi et al. | |
| 6,360,144 B1 | 3/2002 | Bacchi et al. | |
| 6,366,830 B1 | 4/2002 | Bacchi et al. | |
| 6,453,214 B1 | 9/2002 | Bacchi et al. | |
| 6,577,382 B1 * | 6/2003 | Kida et al. | 355/77 |
| 6,697,145 B1 * | 2/2004 | Aoyama | 355/53 |

FOREIGN PATENT DOCUMENTS

| | | |
|---|---|---|
| JP | 09-160651 | 6/1997 |
| JP | 11-106044 | 4/1999 |
| JP | 11-150172 | 6/1999 |
| JP | 2000-182561 | 6/2000 |
| JP | 2000-200810 | 7/2000 |
| JP | 2001-253536 | 9/2001 |

* cited by examiner

*Primary Examiner*—Henry Hung Nguyen
(74) *Attorney, Agent, or Firm*—Oblon, Spivak, McClelland, Maier & Neustadt, P.C.

(57) ABSTRACT

An alignment method for substrates includes preparing an alignment apparatus having a movement mechanism to move a target substrate in horizontal and vertical directions, a rotation mechanism to rotate the substrate in a horizontal plane, an illumination tool to irradiate the substrate, an image sensor to pick up an substrate image, an edge position sensor to sense the substrate edge positions, and a control computer, transferring the substrate from a previous stage using the moving mechanism, measuring the substrate position using the image sensor which picks up the image on a back surface of the substrate, while irradiating the substrate with the illumination tool from a sidewise direction, calculating positional shifts regarding X, Y, and θ of the mask, using the edge position sensor and control computer, correcting the positional shifts of the mask by the moving and rotation mechanisms, and transferring the substrate to a next stage.

20 Claims, 9 Drawing Sheets

ALIGNMENT METHOD

CROSS-REFERENCE TO RELATED APPLICATIONS

This application is a continuation of application Ser. No. 10/397,288, filed Mar. 27, 2003, which is now U.S. Pat. No. 6,901,314 and is based upon and claims the benefit of priority from the prior Japanese Patent Application No. 2002-089780, filed Mar. 27, 2002, the entire contents of which are incorporated herein by reference

BACKGROUND OF THE INVENTION

1. Field of the Invention

The present invention relates to an alignment apparatus for substrates, particularly to an alignment apparatus for substrates preferable for positioning the substrates in a manufacturing or transferring apparatus of the substrates such as a semiconductor substrate, liquid crystal panel substrate, and mask substrate.

2. Description of the Related Art

In recent years, in a semiconductor manufacturing apparatus, there have been demands not only for further improvement in operation stability, productivity, and accuracy but also for flexible treatment of various types of product as well as one standard product. For example, in recent years, a mini-manufacturing line in which various types of product are manufactured in small quantities has been noted. In the background, one of the aims lies in that various types of product are handled by one manufacturing apparatus to reduce manufacturing costs.

In detail, as represented by an original plate mask substrate for exposure, liquid crystal panel, and plasma display, there has been a demand for a manufacturing apparatus which can handle substrates including a plurality of materials and outer shape standards. In this manufacturing apparatus, it is important to transfer the substrate to an accurate predetermined position regardless of the type of substrate, and it is necessary to dispose an alignment apparatus which meets this demand. Moreover, naturally, for yield improvement of substrate manufacturing, generation of waste or damage in a transfer or alignment operation needs to be avoided, and it is important to realize a mechanism in which dust is not generated in principle.

In a related-art alignment apparatus, because of simplicity of the mechanism, the substrate has heretofore been positioned or centered by an abutment method for general purposes, but the generation of waste or damage by contact of an abutment portion or frictional movement of the substrate has raised problems. Then, to solve the problem, a non-contact system centering apparatus or positioning transfer apparatus has been proposed. Examples of the apparatus are disclosed in Jpn. Pat. Appln. KOKAI Publication Nos. 11-106044 and 11-150172, but any of these is limited to a wafer having a predetermined size, and different sizes cannot be handled. Moreover, considering application of these known techniques to a rectangular substrate, not to the wafer, the substrate thickness varies, there are various types made of transparent or opaque materials, and therefore a combination of the above-described known arts cannot satisfy desired requirements.

The related art includes an example in which with various types of substrate thicknesses, a substrate mounting holder for exclusive use is used to transfer the substrate. In Jpn. Pat. Appln. KOKAI Publication No. 2000-182561, there is proposed a method of measuring the substrate thickness in an electron beam drawing apparatus. However, in this example, the apparatus configuration becomes complicated, and it is necessary to automatically transfer and align the substrate onto the holder. Moreover, for example, in a mask original plate for exposure, an opaque film, halftone film, photosensitive resist, and conductive thin film are formed, and in many cases it is difficult to sense the position of the substrate with optically predetermined accuracy and likelihood.

Particularly, as represented by notch detection of the wafer, in a notch detection method of emitting light from a substrate surface side, and receiving the light on a substrate back surface side to detect a light amount change, a detection error has been caused by an edge cut of a wafer peripheral portion of resist or an optical property or film thickness non-uniformity of film formation of an underlayer. Moreover, the film formed in the substrate surface is generally turned and formed also into substrate side surfaces. Therefore, when only a usual laser displacement sensor is used, it is difficult to sense the position with the predetermined accuracy. Furthermore, even when the presence/absence of the substrate is sensed by a threshold value of a reflection amount of laser beams, it has been difficult to accurately sense the substrate because of various film states described above.

In this manner, it has heretofore been difficult to perform accurate alignment regardless of the types of the substrates including a plurality of materials and outer shape standards or without being influenced by the film formed on the substrate surface or without causing dust generation or substrate damage or breakage. Moreover, in the substrate manufacturing apparatus, there has been a demand for realization of an alignment apparatus which can preferably be applied regardless of environment, such as the atmosphere and vacuum, and which is simple and inexpensive.

BRIEF SUMMARY OF THE INVENTION

According to a first aspect of the present invention, there is provided an alignment apparatus for substrates, comprising:

a first movement mechanism which moves a substrate to be treated in a horizontal direction;

a second movement mechanism which moves the substrate in a vertical direction;

a rotation mechanism which rotates the substrate in a horizontal plane;

an illumination tool to irradiate the substrate with illumination light from a sidewise direction in a state in which the substrate is held in a desired height position by the second movement mechanism;

an image sensor which picks up an image on a back surface of the substrate in an irradiated state with the illumination light;

an edge position sensor which senses a plurality of edge positions of the substrate from an image obtained by the image sensor; and a control computer which obtains a positional shift of the substrate based on the edge positions sensed by the edge position sensor and which corrects a positional shift of the horizontal direction and a rotation direction by the first movement mechanism and the rotation mechanism.

According to a second aspect of the present invention, there is provided an alignment apparatus for substrates, comprising:

a transfer robot comprising an end effecter, the end effecter being configured to mount a substrate to be treated thereon and to be driven in a direction of a horizontal plane and a vertical direction;

an end effecter position sensor which senses a position in the horizontal plane and the vertical direction of the end effecter;

a stage configured to mount the substrate thereon and to be rotatable;

an illumination tool which irradiates the substrate mounted on the end effecter with an illumination light from a sidewise direction of the substrate;

an image sensor which senses an image of the substrate on a back surface side thereof;

an edge position sensor which senses edge positions of a plurality of portions of the substrate from the sensed image; and a control computer which positions the end effecter at a reference height in accordance with a thickness of the substrate in a state of the substrate moved to a predetermined position in the horizontal plane by the transfer robot and which calculates a relative positional shift between the substrate and the end effecter by the edge position sensor and the end effecter position sensor and which corrects the positional shift of the substrate in the horizontal plane by the transfer robot based on a calculation result and which positions and mounts the substrate having the positional shift corrected on the stage so as to be centered and which corrects the positional shift of the substrate in a rotation direction by the stage.

BRIEF DESCRIPTION OF THE SEVERAL VIEWS OF THE DRAWING

FIG. 10A shows an example of a COG mask, FIG. 10B shows an example of a special purpose (SUS) mask, and FIG. 10C shows an example of a halftone mask, the special mask being made of SUS imaging a mask holder;

FIG. 11A shows another example of the COG mask, FIG. 11B shows another example of the special purpose (SUS) mask, and FIG. 11C shows another example of the halftone mask;

DETAILED DESCRIPTION OF THE INVENTION

Prior to concrete description of embodiments, functions of the embodiments will generally be described. In the present embodiment, an image is picked up on a back surface side of a substrate in a state in which the substrate is irradiated with light from a side surface direction. Thereby, edge positions of a plurality of portions of the substrate are sensed in non-contact. Therefore, original plates for exposure such as a reticle substrate can be transferred and positioned in non-contact without rubbing the substrate, and it is possible to reduce generated dust or damage.

It is to be noted that here non-contact means positioning without using an abutment mechanism, and naturally a tip end (end effecter) of a transfer robot or a substrate holding portion of a rotational stage contacts the substrate.

Additionally, accurate alignment can be realized regardless of a material and size of the substrate.

This alignment method is especially effective, when the method is applied to a mask transfer system of a manufacturing apparatus, such as a mask writer, photo stepper, 1× exposure tool and resist coater developer.

Moreover, for various types of substrate, such as a transparent glass substrate, whose upper surface or upper and side surfaces are subjected to treatment such as film formation and which have shapes of a square and rectangle and large/small sizes or thicknesses, accurate and secure alignment can also be realized with respect to all the substrates.

The embodiments of the present invention will be described hereinafter with reference to the drawings. It is to be noted that in the following embodiments, an example of a transfer system in a writing tool of an original plate mask substrate for exposure will be described. That is, the present invention is applied to an alignment apparatus in transfer in high vacuum to reduce generated dust, so that accurate alignment is performed regardless of the material or size of the substrate.

(First Embodiment)

Figure 1:
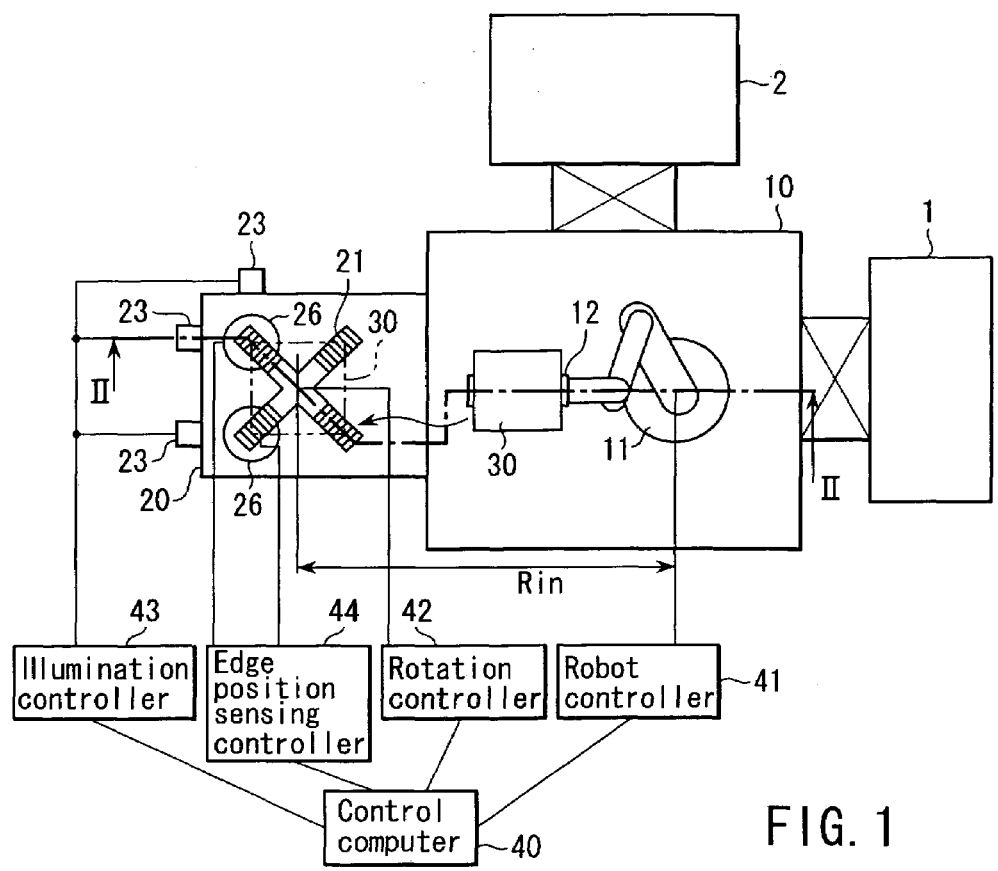
FIG. 1 is a schematic plan configuration diagram showing a relationship between an alignment apparatus for substrates and peripheral apparatuses according to a first embodiment.
Figure 2:
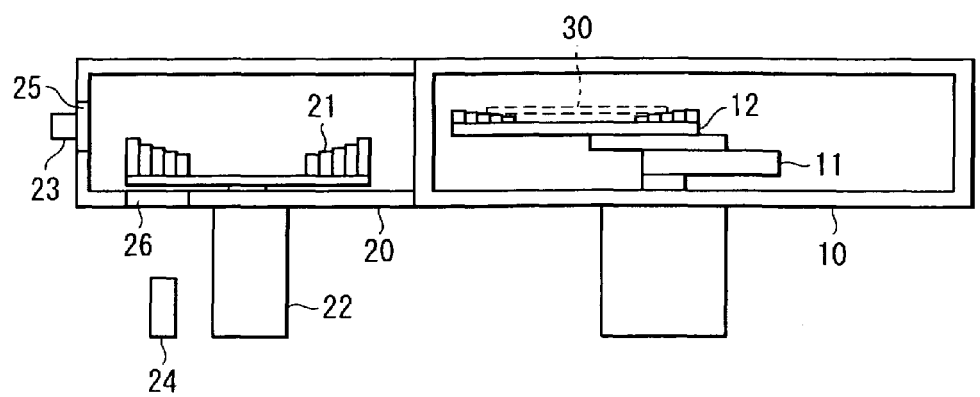
FIG. 2 is a sectional view of the alignment apparatus along line II—II of FIG. 1.

FIG. 1 is a schematic plan configuration diagram showing an alignment apparatus for substrates according to a first embodiment of the present invention, and FIG. 2 is a sectional view along line II—II in FIG. 1. The alignment apparatus of this embodiment is disposed in a portion of a mask transfer system for an electron beam mask writer. The apparatus aligns the mask substrate correcting its positional shift at the halfway stage while transferring the substrate in load lock chamber 1 supplied from a mask stocker (not shown) to writing stage 2.

A transfer robot 11 is disposed in a first chamber 10, and an end effecter 12 for mounting and supporting a substrate 30 is attached to an arm tip end of the robot 11. The transfer robot 11 is driven by a robot controller 41 which controls a position, angle, speed, and acceleration of the arm tip end (end effecter) 12 and which realizes accurate transfer. When the transfer robot 11 is driven, the mask substrate 30 is transferred. Moreover, an encoder is disposed in a robot main body in order to monitor the existing position of the end effecter 12. Based on a signal of the encoder, the transfer robot controller 41 controls the driving.

A second chamber 20 is disposed adjacent to the first chamber 10, and a rotational stage 21 on which the mask substrate 30 is laid is disposed in the chamber 20. This stage 21 is rotated/driven by a stepping motor 22 under control of a rotation controller 42. Concretely, the rotation controller 42 controls the number of pulses of the stepping motor 22, and realizes movement in a predetermined clockwise or counterclockwise direction.

Illumination tools 23 are disposed on side surfaces of the second chamber 20, and image sensors (CCD cameras) 24 are disposed below. The illumination tools 23 light the side surfaces of the mask substrate 30, and are disposed, for example, in three outer portions of the chamber 20. The illumination tools 23 use white light, for example, from a high-luminance LED which is a light source, and are disposed via diffusion plates. The high-luminance LED has a quick response in switching and a stable light intensity. However, the LED sometimes shows an unevenness of surface light intensity due to discrete light source points of constituent light emitting elements. Therefore, the diffusing plate is used to uniform the light intensity. The illumination tools 23 are controlled by an illumination controller 43, and the illumination controller 43 has a dimmer function of an illumination light intensity.

The image sensors 24 are controlled by an edge position sensing controller 44 to pick up a back surface image of the substrate 30 as two-dimensional data. Among the sensed image, the edge position sensing controller recognizes, as an edge position of the substrate, a changing portion of the light intensity from light to shade in the viewing field of the CCD image sensor. The light and shade are provided by gray-scale processing of the light intensity subjected to the respective pixels.

Further, the respective pixels are assigned to the three primary colors of the light, i.e., R, G and B, and a set of three pixels each corresponding to R, G and B recognizes the image data. Therefore, if a conventional red LED is used in the illumination tool, for example, the edge of the object is recognized as red, so that the edge is sensed by only the red pixels. In this case, the sensitivity and resolution are reduced to one-third. In case of the white light, the edge is recognized by the data averagely sensed by the three pixels, so that there occurs no reduction of the sensitivity and resolution. Due to the above reason, a white light is used in the illumination tool. In this connection, the resolution of the edge sensing is three pixels by the red light, and one pixel by the white light.

Incidentally, a pattern recognition method is also applicable to the edge sensing by the edge position sensing controller 44, in addition to the sensing method sensing a changing portion of the light intensity, i.e., a changing portion of light and shade in the sensed image, as aforementioned. In the present embodiment, both methods are usable since the difference is in the edge sensing method by the edge position sensing controller 44. The pattern recognition method senses an edge position by searching a portion coincident to the recognized pattern, which is recognized beforehand by the edge position sensing controller 44 as an image data of the light and shade pattern of the edge to be inspected, by comparing the actual light and shade pattern of the edge of the mask substrate.

The image sensors 24 are provided, for example, at two positions to sense the images at the plural portions of the substrate, and it suffices that the image sensors 24 are so disposed as to be able to sense the three points of the edges on the two sides each extending to a different direction. When the image of the corner of the substrate is picked up by one of the sensors 24, two points (e.g., X1, Y1 in FIG. 6 described later) can be sensed by one sensor. Therefore, the sensors 24 may be disposed in two portions. Moreover, the rotational stage 21 was formed substantially in a cross shape not to block view fields of the image sensors 24. A control computer 40 is a main controller of the present apparatus, and has a function of controlling the respective controllers 41 to 44.

As shown in FIG. 2, the image sensor 24 is disposed below the rotational stage 21, and the illumination tool 23 is attached to the side surface of the chamber 20. Moreover, the chamber 20 including the rotational stage 21 has a vacuum atmosphere. Therefore, the image sensor 24 and illumination tool 23 are disposed over walls of the chamber 20 via view ports 25, 26. Similarly, the stepping motor 22 is connected to the rotational stage 21 via a magnetic fluid seal for vacuum (not shown). Moreover, a step-shaped base is formed in the rotational stage 21 in accordance with the size of the mask substrate 30. The mask substrates 30 are mounted on different step surfaces in accordance with the sizes.

In the present embodiment, the steps are disposed in accordance with the sizes of usual standard products, such as 5, 6, 7, 8, and 9 inches, and only a peripheral portion of the mask substrate 30 is laid on the corresponding step. Similarly, the step is also disposed on a mask substrate holding portion of the end effecter 12 attached to the transfer robot 11 in accordance with the size of the mask substrate 30. The mask substrates 30 having various sizes are mounted and supported so that substantially a substrate middle portion is aligned in a reference position of the end effecter 12 regardless of each size.

Figure 3:
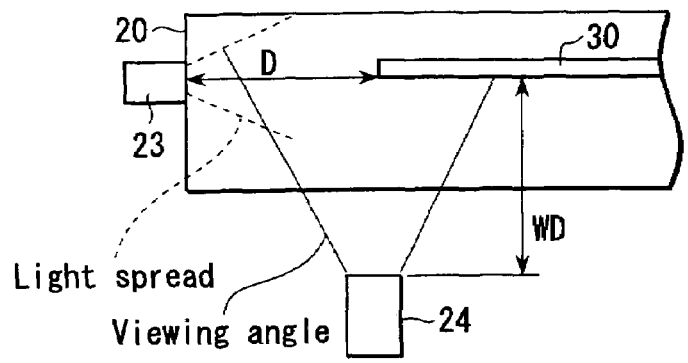
FIG. 3 is a sectional view showing a configuration of a substrate edge position sensing portion in the first embodiment.

Next, an installation relationship of the image sensor 24 and illumination tool 23 with respect to the chamber 20 will be described with reference to FIG. 3. In FIG. 3, a bottom surface of the mask substrate 30 and light emission center portion of the illumination tool 23 are disposed on substantially the same plane. A distance D between the light emission surface of the illumination tool 23 and a mask substrate side surface changes in accordance with the mask substrate size. An emission direction from the illumination tool 23 has a spread angle under approximately 40 degrees, and a light having weak directivity is used. A distance WD between the image sensor 24 and the bottom surface of the mask substrate 30 is determined from a relation among a focal distance determined from a combination of the CCD camera and lens, necessary view field size, and sensing resolution per pixel. In the present embodiment, to sense the edge of the mask substrate having a size of 5 to 9 inches in a micron order, a camera is used in which a view field size is set to about 100 mm×100 mm and the number of effective pixels is 5120. Furthermore, processing by the unit of sub-pixel is performed by image processing, and measurement of the micron order is possible.

Since the configuration shown in FIG. 3 prevents the halation induced by a regular reflection, the image of a scattered light from the substrate edge is formed with high quality, and high-quality edge measurement by the image sensor 24 is assured. It is to be noted that in FIG. 3 the bottom surface of the mask substrate 30 and the emission center portion of the illumination tool 23 are disposed substantially on the same plane. However, the emission direction has an allowable range of the spread angle of about 40 degrees or less. Therefore, even when the surface and portion are not necessarily disposed on the same plane, the present measuring unit fulfils a sufficient function. For example, even a height shift by about five times the substrate thickness is allowable as long as the edge scattered light is generated. Even with the shift of the height direction of the illumination tool 23 or inclination in the center direction of the emitted light in the range in which the edge scattered light is generated, a high-quality edge image is formed. Therefore, high-accuracy measurement is possible.

It is to be noted that with the use of the image sensor 24, it is necessary at least a part of the view field is illuminated, and a coaxial vertical illumination or backlight method is generally used. However, in this method, to recognize the position of the substrate whose surface is nearly a mirror surface, other constituting components such as the image sensor 24 are reflected in the substrate itself. Because of such an influence, there has been a problem that image recognition is inaccurate or impossible. In the configuration according to the present embodiment, since the light is emitted from the side surface of the substrate, there is basically no problem of reflection. Further, in a image sensing method using the regular reflection such as in the coaxial vertical illumination or backlight illumination, there is a problem that sensing becomes unstable depending on a material of the edge to be inspected and a surface condition of the edge. On the contrary, the present embodiment adopts sidewise illumination with the result that high sensing stability is obtained, since the CCD image sensor senses the scattered light reflection image instead of the regular reflection image.

Figure 4:
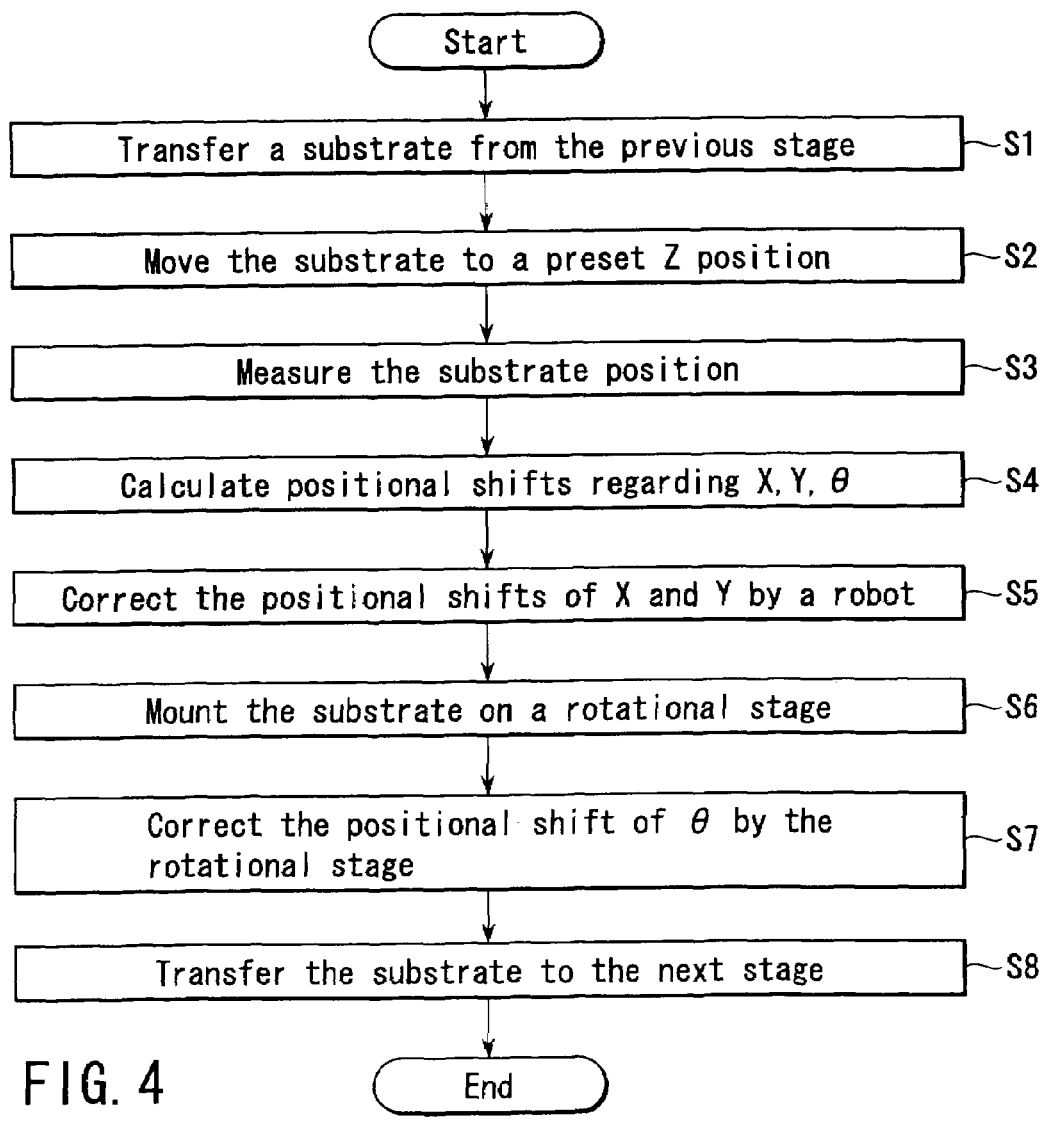
FIG. 4 is a flowchart showing an alignment operation in the first embodiment.

Next, a basic process flow in the present embodiment will be described with reference to FIG. 4.

First, for example, the mask substrate 30 mounted on the end effecter 12 of the transfer robot 11 is transferred to a predetermined vertical position in the second chamber 20 through the fist chamber from the load-lock chamber 1 (step S1).

The transfer robot 11 is driven to move the substrate 30 to a predetermined Z-axis position (height) in the second chamber 20 in accordance with the size of the substrate 30 mounted on the end effecter 12 (step S2).

In a state in which the substrate 30 is held to be horizontal in the Z-axis position, the illumination tool 23 and camera 24 are used to measure the edge position of the substrate 30 (step S3).

Shifts of the substrate 30 in an in-plane direction (X, Y directions) and rotation direction (θ direction) are calculated based on the measured edge position (step S4).

When the transfer robot 11 is driven/controlled based on the shifts calculated in S4, the positional shifts of the X and Y directions are corrected (step S5).

Subsequently, the transfer robot 11 is driven in a Z-axis direction to mount the substrate 30 onto the substrate holding portion of the rotational stage 21 (step S6).

Thereby, the axes of the center of the substrate 30 and rotation center of the rotational stage 21 are aligned. Subsequently, the rotational stage 21 is driven/controlled to correct a rotational shift of the substrate 30 (step S7).

The corrected substrate is disposed on the end effecter 12 of the robot 11 again. The substrate 30 is transferred to the predetermined position of the next stage, while the corrected position state is held (step S8).

As described above, according to the present embodiment, in a state in which the mask substrate 30 is laid on the end effecter 12 of the transfer robot 11 and positioned in the Z-axis direction, the substrate 30 is irradiated with the light from the side surface direction by the illumination tool 23. Moreover, the scattered light of the edge portion on the back surface side of the substrate 30 is sensed by the image sensor 24, so that the edge positions of a plurality of portions of the substrate 30 can be measured. Furthermore, the rotational stage 21 and transfer robot 11 can be driven based on measured information to correct the positional shift of the substrate 30. In this case, the positional shift of the substrate 30 can be corrected with non-contact. Therefore, without rubbing the substrate 30, it is possible to reduce generated dust or damage.

Moreover, accurate alignment can be realized regardless of the material and size of the substrate 30. This is especially effective when the present invention is applied to a mask transfer system of a manufacturing apparatus, such as a mask writer, photo stepper, 1× exposure tool and resist coater developer.

Furthermore, for various types of substrates, such as a transparent glass substrate, whose upper surface or upper and side surfaces are subjected to treatment such as film formation and which have shapes of a square and rectangle and large/small sizes or thicknesses, accurate and secure alignment can also be realized with respect to all the substrates. Even when the light is transmitted through the substrate as in a halftone mask, the accurate alignment is possible.

Additionally, concerning the movement of XY and Z directions, since the movement mechanism generally disposed in the transfer robot 11 is used, it is not necessary to dispose these movement mechanisms for alignment. That is, only the rotational stage 21 may be disposed for the alignment, and XY and Z stages do not have to be disposed, so that the configuration of the alignment apparatus can be simplified.

(Second Embodiment)

Figure 5:
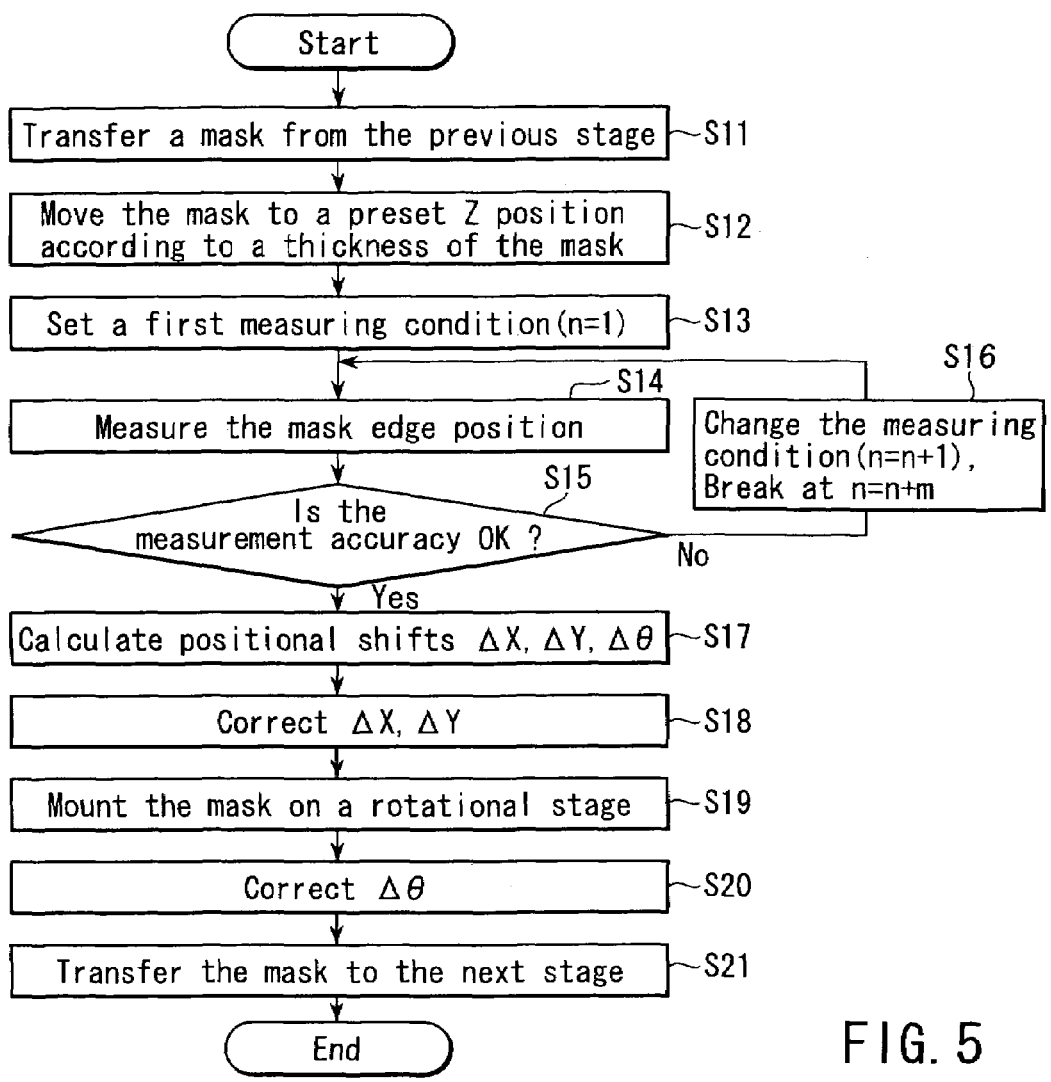
FIG. 5 is a flowchart showing an alignment operation in a second embodiment.

In a second embodiment, a concrete process flow in using the alignment apparatus (FIGS. 1 to 3) of the first embodiment to perform the alignment will be described with reference to FIGS. 5 and 6. It is to be noted that FIG. 5 is based on FIG. 4 of the first embodiment. In the second embodiment, an operator inputs the size and thickness of the mask substrate 30 as mask substrate information into the control computer 40 of the alignment apparatus beforehand.

Figure 6A:
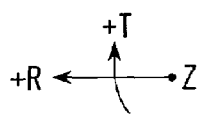
FIG. 6A shows a coordinate system of a transfer robot.
Figure 6B:
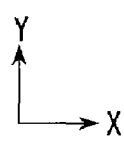
FIG. 6B shows a coordinate system of an image sensor.

Moreover, a coordinate system in the present embodiment is as shown in FIGS. 6A and 6B viewed from a front surface side of the substrate. FIG. 6A shows the coordinate system of the transfer robot 11 which has transfer axes in an expansion/contraction direction (R), turning direction (T), and height direction (Z), and Z axis has a + direction on a sheet surface upper side. FIG. 6B shows a sensing coordinate system of the image sensor 24. In the coordinate system of the transfer robot 11, the distance to the reference position of the end effecter 12 from a turning center is assumed to be R. The reference position of the end effecter 12 agrees with the center of the mask substrate 30 ideally mounted on the end effecter 12 in a state in which there is no positional shift of the mask substrate 30.

Figure 6C:
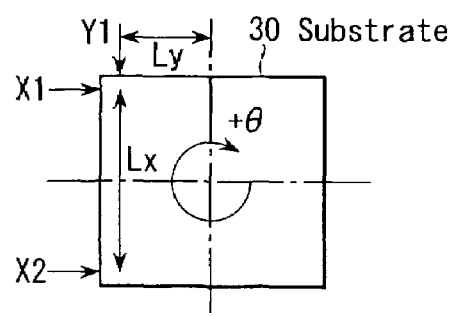
FIG. 6C shows a coordinate system of a rotational stage, which defines an edge position of a substrate mounted on a stage.

FIG. 6C shows the coordinate system of the rotational stage 21. The edge positions of the mask substrate.30 measured when the mask substrate 30 is transferred onto the rotational stage 21 are denoted with X1, X2, Y1. A distance between X1 and X2 is set to be a predefined distance Lx, and X1, X2, Y1 are pre-adjusted in a predetermined arrangement on the basis of the measured coordinate position of the image sensor 24. In the present embodiment, Lx is set to 100 mm, and Ly is set to 50 mm.

A concrete process flow is shown in FIG. 5. First, the mask substrate 30 is transferred to a predetermined R, T position by the transfer robot 11 (step S11). Here, the predetermined position is the position of the mask substrate 30 before the substrate is laid onto the step of the rotational stage 21, and concretely indicates the R, T position where the center position of the rotational stage 21 agrees with the reference position of the end effecter 12 of the transfer robot 11. When the mask substrate 30 is transferred to the coordinate position, as shown in FIGS. 1 to 3, the mask substrate 30 exists in a region where the position can be sensed by the combination system of the image sensor 24 and illumination tool 23.

It is to be noted that the predetermined positions are denoted with Rin, Tin, Zin. In the present apparatus, Rin is set to about 600 mm, Tin is set to 0 degree, and Zin is set to 30 mm. Moreover, usually in the transfer system using the robot, teaching is usually performed beforehand. In the present embodiment, the teaching is performed beforehand as well, to store the Rin, Tin, Zin positions. Therefore, in step S11, the transfer robot 11 is driven/positioned/controlled into the Rin, Tin, Zin positions, so that the mask substrate 30 is transferred.

Subsequently, based on a value input to the control computer 40, which is information of the mask substrate 30, the mask substrate 30 is transferred to a predetermined Z position in accordance with the size of the mask substrate (step S12). Concretely, in this Z position, as described with reference to FIG. 3, the distance WD between the CCD camera of the image sensor 24 for use in the present embodiment and the back surface of the mask substrate 30 indicates a desired value. With a different substrate size, the load on the transfer robot 11 also changes. Therefore, a front portion of the end effecter 12 attached to the robot 11 bends slightly downwards, and the distance WD changes. Therefore, in step S12, the robot is driven in the Z position also in consideration of this bend, and the distance WD is controlled to be substantially constant regardless of the substrate size.

Subsequently, a predetermined edge measuring condition of the mask substrate 30 (first condition in the present embodiment) is set (step S13). Subsequently, a mask edge is measured (step S14). Next, accuracy of the measured value is judged (step S15).

In the judgment of measurement accuracy, error of measurement is also judged. If NG, a measuring condition (light intensity or pattern recognition standard) different from the first condition is set (step S16), and the measurement is performed again. Even if the measuring condition is changed m or more times, the judgment of the measurement accuracy is NG. In this case, the process is discontinued. When the measurement accuracy is OK, components $\Delta X$ and $\Delta Y$ of translation shift of the mask, and rotation component $\Delta \theta$ are calculated as the positional shifts to be corrected from a relative position of measured X1, X2, Y1 (step S17).

In the present embodiment, an offset is set in accordance with the substrate size to execute the process, so that measured values X1, X2, Y1 indicate the shifts from the edge positions of the mask substrate 30 having no positional shift. For example, with 5009 masks in which the size of the mask substrate 30 is five inches, the edge positions of the mask substrate 30 having no positional shift are set to reference positions X1(5009), X2(5009), Y1(5009). Moreover, when raw data X1raw, X2raw, Y1raw is measured by the CCD camera 24, the positional shifts of the reference positions from the mask in three measurement positions are given by X1raw-X1 (5009), X2raw-X2 (5009), Y1raw-Y1 (5009). In this case, a substantial positional shift (Xt, Yt) of the X and Y directions is expressed as follows: Xt=[{X1raw-X1 (5009)}+{X2raw-X2 (5009)}]/2, Yt=Y1raw-Y1 (5009), which are functions of the translation shifts $\Delta X$, $\Delta Y$ and the rotation component $\Delta \theta$.

Moreover, in the coordinate system shown in FIGS. 6A to 6C, when a mask size is set to 2 L from geometric arrangement, the above-described Xt and Yt are in a relation of $Xt = L(1-\cos\theta_t) + \Delta X$, $Yt = -L(1-\cos\theta_t) + L\sin\theta_t + \Delta Y$, $\theta t = \tan^{-1}\{(\text{X1raw-X}\mathbf{1}\ (\mathbf{5009})) - (\text{X2raw-X}\mathbf{2}\ (\mathbf{5009}))/\text{Lx}\}$. Naturally, a different value of 2L is used in accordance with the size of an object mask of the alignment. With the five-inch mask as in the present example, the value is five inches, and with the six-inch mask the value is six inches.

Therefore, the translation shifts $\Delta X$, $\Delta Y$ of the mask are calculated from these relations and actual measurements. When the transfer robot 11 is driven/controlled in the R and T axes, $\Delta X$ and $\Delta Y$ are corrected (step S18). Here, a driving amount $\Delta T$ of the T axis of the transfer robot 11 driven to correct $\Delta Y$ is obtained from a relation of $\Delta Y = \text{Rin} \cdot \sin(\Delta T)$. Therefore, the driving of Rin+$\Delta X$ and then the driving of Tin-$\Delta T$ are performed in the transfer robot 11, and the translation shift of the mask is substantially corrected, so that the center of the mask substrate 30 agrees with the rotation center axis of the rotational stage 21 with the predetermined accuracy.

Subsequently, the mask substrate 30 is moved downwards and mounted on the step of the rotational stage 21 by the transfer robot 11 (step S19). Next in step S20, the rotational stage 21 is driven to correct the shift $\Delta \theta$ of the rotation component. Here, since the rotation shift $\Delta \theta$ substantially has a size of $\theta t - \Delta T$, the rotating/driving of $-(\theta t - \Delta T)$ is performed to correct the shift (step S20). It is to be noted that the actual positional shift is caused by the accuracy of the mechanical configuration of the transfer system and installation error in setting the substrate into the transfer system. However, in the present apparatus, the transfer system is adjusted by about ±500 μm in the X and Y directions. For example, when the positional shifts in X1, Y1, and X2 are −0.5 mm, 0.5 mm, and 0.5 mm, the rotating/driving is performed by about 700 mdeg in a +θ direction. When the process normally ends, the process goes to the next transfer. In the present embodiment, as described above, the alignment process is performed by a so-called open control.

(Third Embodiment)

Figure 7:
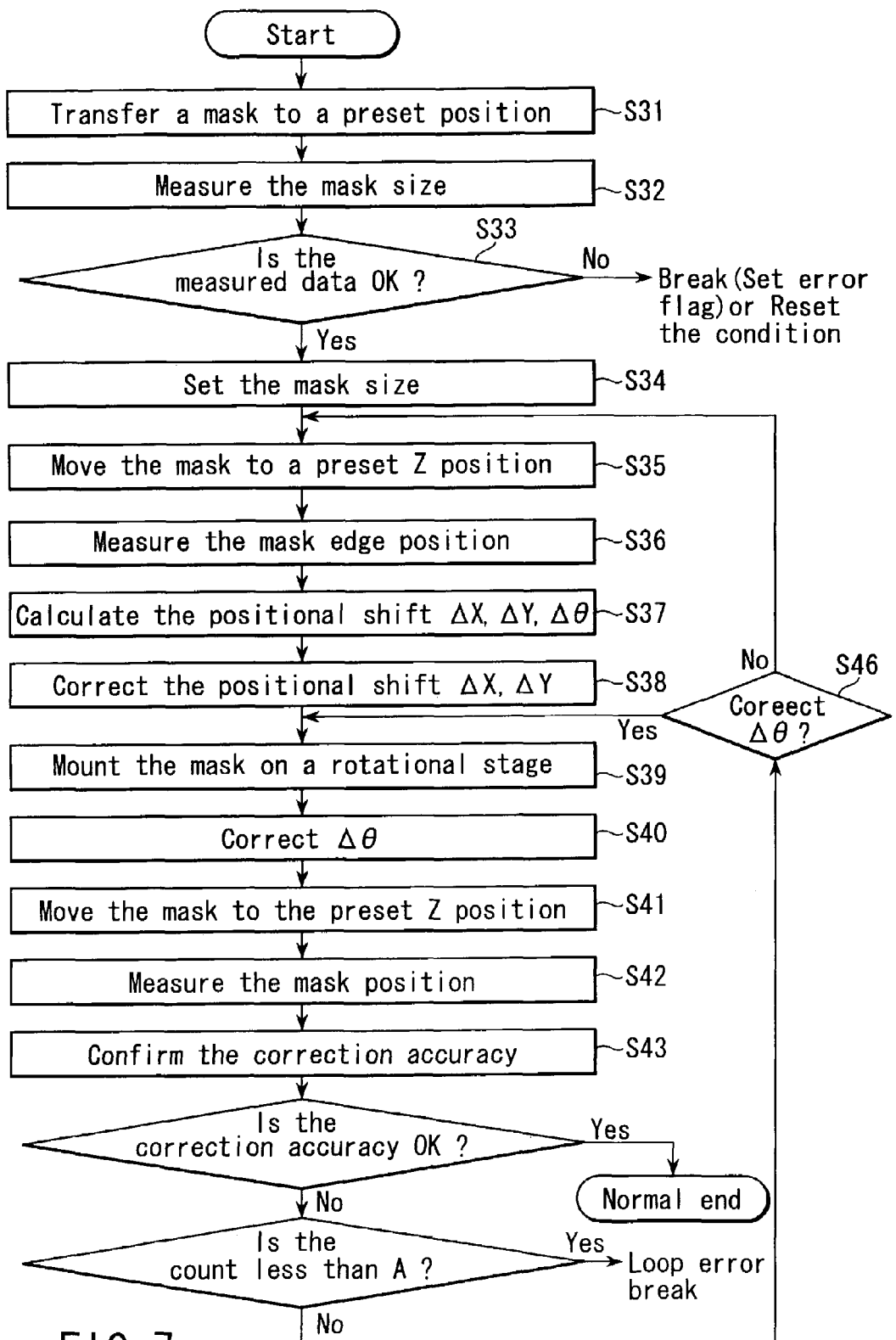
FIG. 7 is a flowchart showing the alignment operation in a third embodiment.

Next, the alignment by another process flow according to a third embodiment will be described with reference to FIG. 7. In the present embodiment, when the size of the mask substrate 30 being transferred is detected without changing the constituting elements of the alignment apparatus described with reference to FIGS. 1 to 3, the thickness of the mask substrate 30 is judged, and the process is performed based on the information. An appropriate alignment process is possible, even when the mask size is not known beforehand. This process flow will be described. Moreover, the present embodiment includes a step of performing a control by a closed loop, so that an appropriate process can be performed so as to obtain a predetermined alignment accuracy.

First, in the same manner as in FIG. 6, the mask substrate 30 is transferred to a predetermined Rin, Tin, Zin position in a region where position sensing is possible (step S31). Subsequently, the mask substrate 30 mounted on the end effecter 12 is measured without changing the Z position (step S32). This measuring condition is used to perform rough measurement and to substantially obtain the edge positions X1, X2, Y1 of the mask substrate 30 without requiring accuracy, and the sensing is judged. In the sensing judgment, it is judged whether or not an error is generated in the measurement.

Subsequently, based on the coordinate data measured in S32, the size of the mask substrate 30 being transferred is calculated/obtained by the control computer 40, and the size is input to a predetermined memory address of the control computer 40 again. Based on this size, the control computer 40 judges the thickness of the mask substrate 30 (step S33). Thereafter, the process of steps S35 to S40 will basically be performed based on the flow described with reference to FIG. 6.

Here, a method of judging the mask size performed in the control computer 40 will be described. In the present embodiment, with respect to the values of X1, Y1, a pixel range corresponding to the edge positions is of the corresponding mask substrate 30 is defined for each mask substrate size beforehand. The mask size is determined by judging the pixel range of the defined size, in which pixel positions of roughly measured X1raw, Y1raw exist. In consideration of a processing error, position error, and transfer error of the mask substrate 30, a margin is set to ±3 mm and the pixel range is set beforehand. Thereby, it is possible to easily judge the size of the mask substrate of a semiconductor equipment and materials international (SEMI) standard product.

For more details, when the values of X1 and Y1 are in the pixel range corresponding to the edge positions of the five-inch mask, the value of five inches is input to the predetermined memory address. When the values are in the pixel range corresponding to the edge positions of the six-inch mask, six inches is written. Moreover, needless to say, even in a rectangular mask substrate which is not the standard product, the judgment is possible by the same method. Needless to say, it is possible to also define the range with respect to the value of X2 and to judge the size from three data.

Moreover, to judge the pixel range in which the mask edge positions exist, as described above, the edge positions at a time when there is not any positional shift are set to reference positions with respect to each mask size beforehand, that is, such as X1(5009), X1(6025), X1(7025), X1(8025), X1(9035), X2(5009), X2(6025), X2(7025), X2(8025), X2(9035), Y1(5009), Y1(6025), Y1(7025), Y1(8025), Y1(9035). Therefore, when the differences between these reference positions and measured raw data X1raw, X2raw, Y1raw are predetermined values or less (±3 mm in consideration of a margin), the value can be judged to be the size of the mask substrate being transferred.

Subsequently, in and after step S41, the driving is performed to the reference Z position again in order to measure the position of the corrected mask substrate 30 (step S41), the measurement is performed (step S42), and the remaining error after the correction is confirmed based on the data (step S43). Subsequently, it is judged whether or not the predetermined correction accuracy is satisfied (step S44). When the correction accuracy is OK, the process goes to the next transfer.

When the judgment is NG, and all the three axes need to be corrected, a series of process of position measurement and correction operations are repeated again to obtain the predetermined accuracy. In this case, when the rotation error only is corrected, the substrate is mounted on the rotational stage 21 to correct the remaining error (step S46). Additionally, in the present embodiment, the number of process loops is counted. When the number exceeds A, the series of process ends (step S45).

As described above, when the process step S41 and the subsequent steps are performed, the control correction of the closed loop is performed, and therefore higher-accuracy alignment can be realized.

(Fourth Embodiment)

Next, concerning the process flow described in the second and third embodiments, setting change of the position measuring condition in the flow of FIG. 5, and mask size measurement in the flow of FIG. 7 will more concretely be described with reference to FIGS. 8 and 9.

Figure 8:
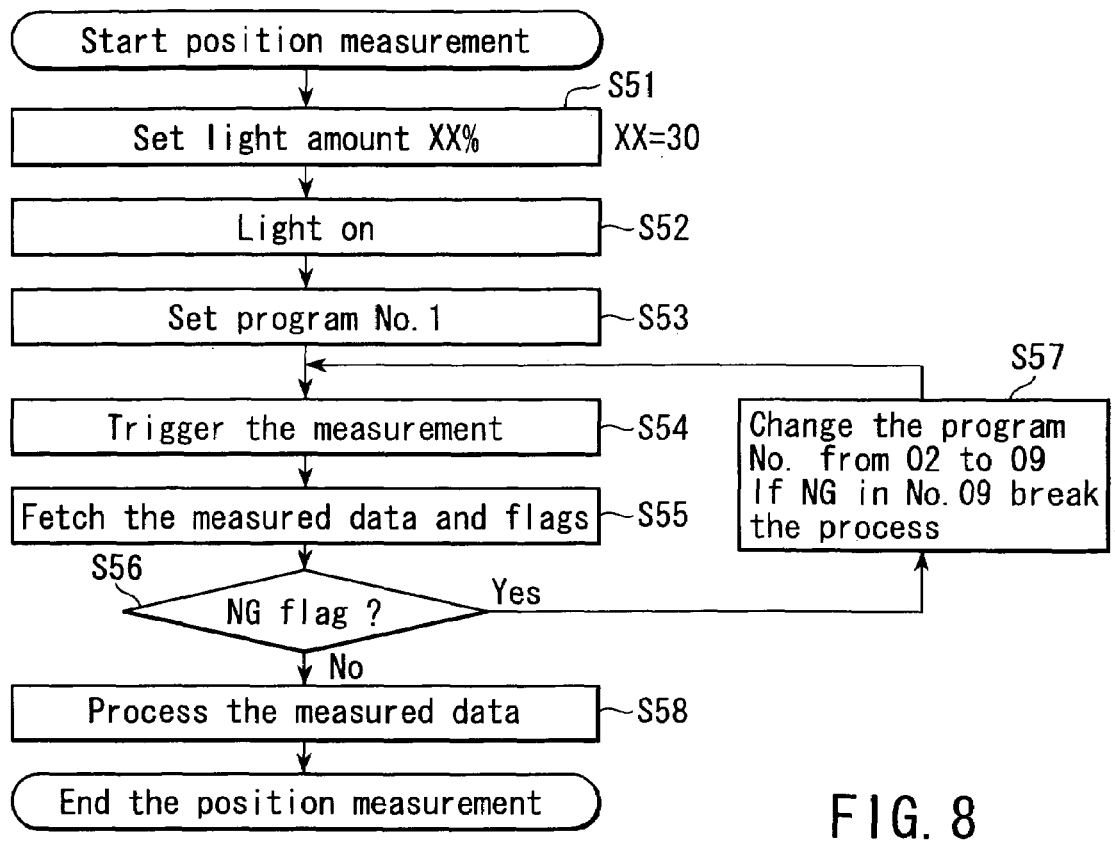
FIG. 8 is a flowchart showing a position measuring operation in a fourth embodiment.

FIG. 8 is a chart showing a process flow in the edge position measurement of the substrate. First, the light amount of the illumination tool 23 is set to XX % of a standard value by the illumination controller 43, such as 30% (step S51). The illumination is lit on under this condition (step S52). The light amount in S51 is a value set in accordance with the mask size measurement, or the mask size input as the mask substrate information.

Subsequently, in the camera controller 44, No. of measurement program is set to No. 1 (step S53). Here, it is meant that a plurality of program numbers including the measuring conditions changed beforehand are prepared in the edge position sensing controller 44 and No. 1 is set among the numbers. For each program No., parameters which are appropriate measuring conditions are set in accordance with the mask size or material. In the parameters, a measurement cursor (box) to designate a measurement range, adjustment of contrast of image data, threshold value, and direction in determining the edge position are set, so that high-accuracy measurement is possible. Therefore, when a plurality of programs are prepared, the measuring conditions can be set in accordance with the mask size and material.

Subsequently, the measurement is triggered, the edge positions are sensed (step S54), and measured data and accompanying OK/NG flags are fetched (step S55). The flags are fetched so as to prevent erroneous sensing, and it is judged whether the flag is OK/NG (step S56).

If the flag is OK, the process goes to step S58, the data is calculated/processed to match with a format of computing/processing in the control computer 40, and the measurement flow normally ends. If the measurement flag is NG in S56, the program No. in the edge position sensing controller 44 is changed, and the measurement is performed, for example, in the program No. 2 (step S57). In the present flow, the programs are set up to No. 09. Even when all the measurement programs are used, the measurement flag is not OK. In this case, the process is discontinued.

Figure 9:
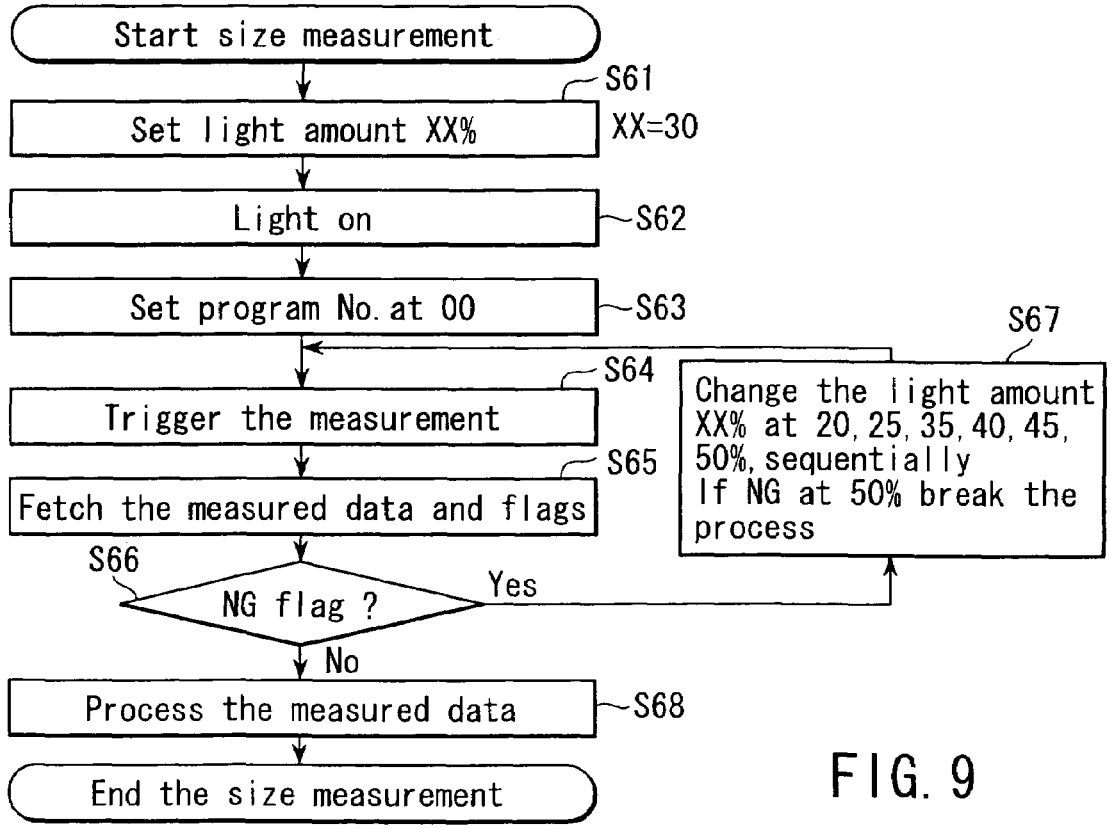
FIG. 9 is a flowchart showing the position measuring operation in the fourth embodiment.

FIG. 9 shows a process flow in the size measurement of the substrate. First, the light amount of the illumination tool 23 is set to XX % of the standard value by the illumination controller 43, such as 30% (step S61). The illumination is lit on under this condition (step S62). Subsequently, the edge position sensing controller 44 sets the program No. 00 for the size measurement (step S63). The program No. 00 is a program in which the condition is set for the size measurement in the edge position sensing controller 44 beforehand, and the parameters concerning the accuracy of the adjustment of contrast, threshold value, and direction in determining the edge position are set to the standard values. This program uses the measurement cursor (box) whose measurement range is designated in a broad range so as to handle various mask sizes.

Subsequently, the measurement is triggered, the edge positions are sensed (step S64), and the measured data and accompanying OK/NG flags are fetched (step S65). The flags are fetched so as to prevent the erroneous sensing, and in the next step the OK or NG flag is judged (step S66).

With the OK flag, the process goes to step S68, the data is computed/processed to match with the format of the computing/processing in the control computer 40, and the measurement flow normally ends. If the measurement flag is NG in S66, in step S67 the light amount in the illumination controller 43 is changed. For example, every loop, the light amount is changed to 20, 25, 35, 40, 45, 50% in order, and the process is performed in the program No. 00 so as to obtain the condition on which the measurement is possible. In the present flow, the amount is set to 50% at maximum. When the measurement flag is not OK even using all the set light amounts, the process is discontinued. In the present embodiment, the light amount is discretely set to seven stages, but dimmer control by each 1% is also possible.

Next, results evaluated using a position measuring unit as a main component of the present invention will be described as experiment results with reference to FIGS. 10A to 10C and 11A to 11C. In the present evaluation, a typical example of the evaluated result in vacuum with respect to the configuration shown in FIG. 3 will be described.

The mask substrate 30 used in FIGS. 10A to 10C and 11A to 11C is a mask which has a SEMI standard size of five and nine inches. With respect to these masks, the experimental results are shown in the figures. For experimental conditions, the CCD camera described in the embodiments was used in the image sensor 24, and a high-luminance LED illumination tool was used in the illumination tool 23.

Moreover, for the mask substrate 30, a substrate was used which had the above-described size and which was formed by coating a usual Cr glass mask, special purpose mask, or halftone mask with resist. The Cr glass mask is also referred to as a chromium on glass (COG) mask, and a quartz glass basically appears on the substrate side surface, but Cr is turned and formed into the film in one portion (about a half of the thickness of the side surface). The special purpose mask is a substrate made of SUS, and manufactured specially for a so-called mask holder. The halftone mask is a glass mask which has a transmittance of about 95% with respect to an exposure light, and the whole substrate is a transparent member. Moreover, in the COG mask of the SEMI standard or halftone mask, the edge portion is chamfered/processed by about 0.2 mm, and the SUS substrate for the special purpose mask measured in the present embodiment is also chamfered in the same manner.

Furthermore, with respect to the chamber 20 in FIG. 3, two examples were used in which the surface of the chamber corresponding to the back surface of the CCD camera 24 on the upper surface and on the vacuum side of the chamber was usually bare SUS, and the surface was treated. In the surface treatment, surface roughness was provided so as to diffuse the light emitted from the illumination tool 23 on the upper surface. Additionally, in the edge sensing in the CCD camera 24, a method was used which comprises: differentiating/processing image contrast to determine the edge position from an intersection of the gradient of the contrast with the set threshold value. In this case, there are two intersections. The position was sensed using two conditions that the gradient was light→dark and dark→light. The above-described conditions were set in the parameters, the light intensity of the illumination tool 23 was set in a range of 20 to 100%, the edge of the mask substrate 30 was measured by the CCD camera 24 ten times, and the average value and dispersion (Max-Min) were evaluated.

Figure 10A:
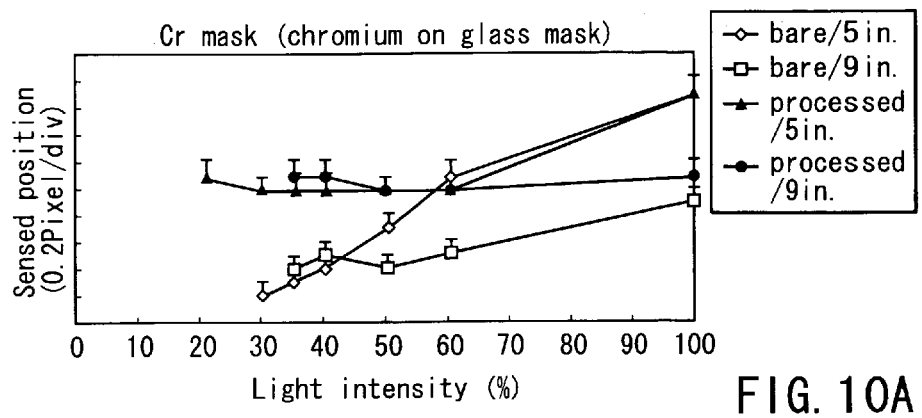
FIGS. 10A to 10C are diagrams showing experimental results (edge position sensing accuracy under a first condition) to which the present invention is applied.
Figure 10B:
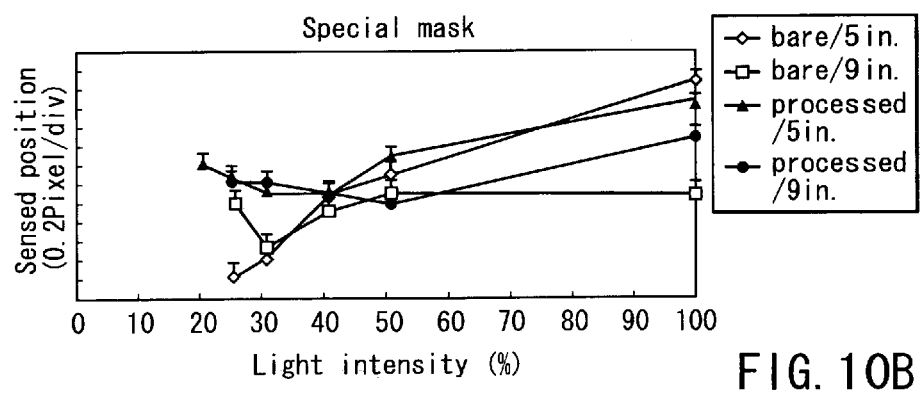
Figure 10C:
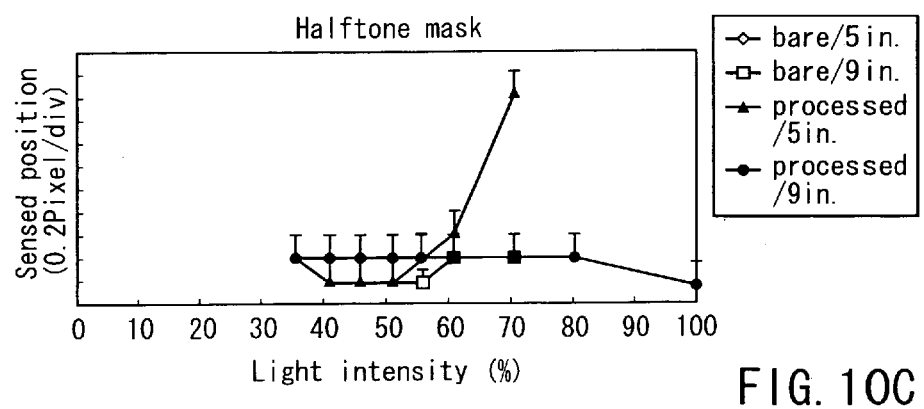
Figure 11A:
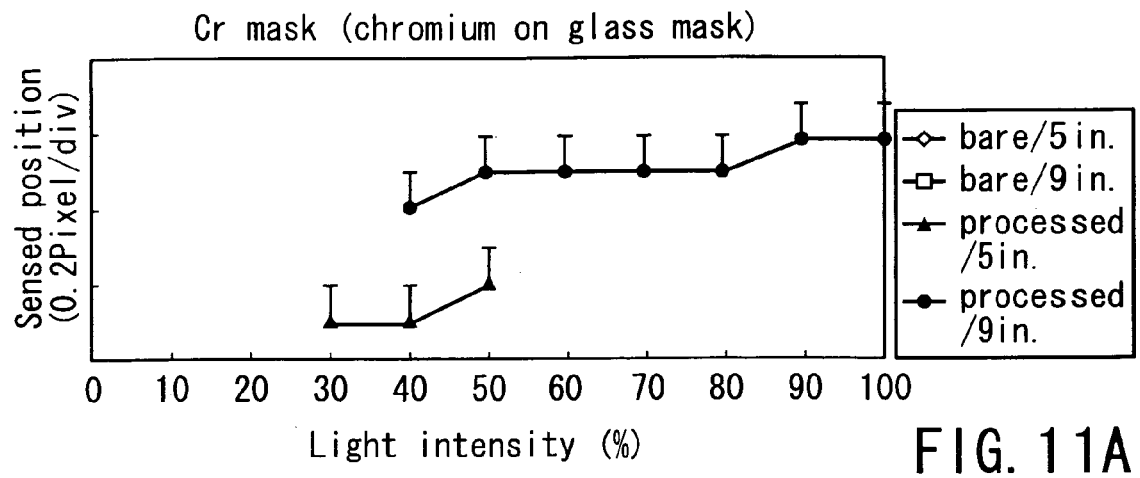
FIGS. 11A to 11C are diagrams showing the experiment results (edge position sensing accuracy under a second condition) to which the present invention is applied.
Figure 11B:
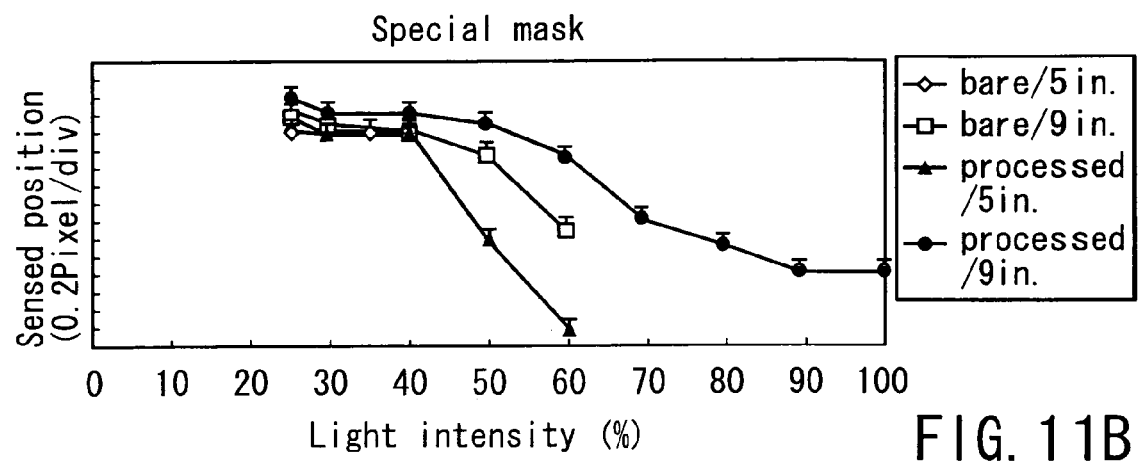
Figure 11C:
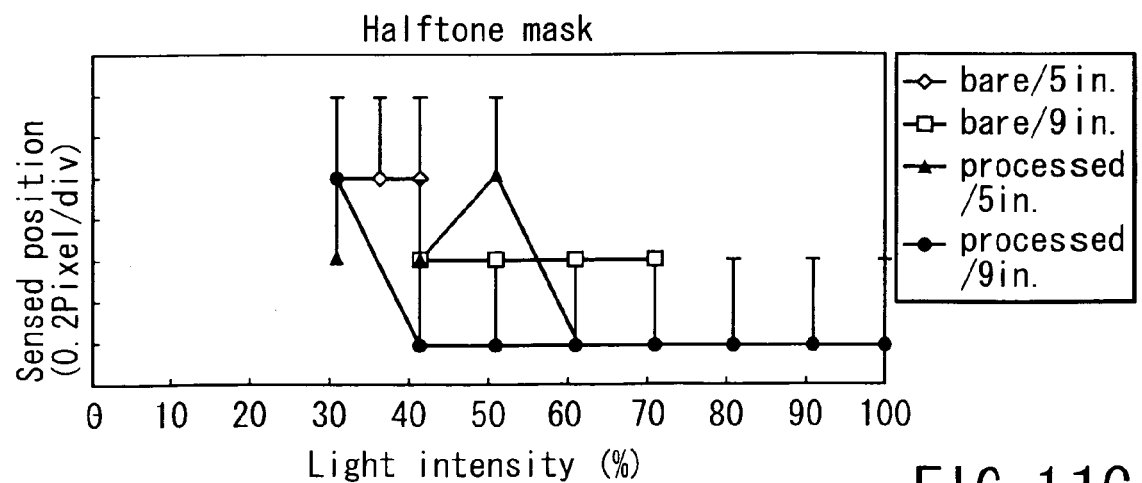

FIGS. 10A to 10C show results on the edge sensing condition of light→dark, FIG. 10A shows the extracted result of the COG mask, FIG. 10B shows that of the special purpose mask, and FIG. 10C shows that of the halftone mask. Similarly, FIGS. 11A to 11C show the results on the edge sensing condition of dark→light, FIG. 11A shows the extracted result of the COG mask, FIG. 11B shows that of the special purpose mask, and FIG. 11C shows that of the halftone mask. The ordinate of the graph shown in FIGS. 10A to 10C and 11A to 11C indicates the mask edge position sensed by the CCD camera 24 in 0.2 pixel/div. The abscissa indicates the illumination light intensity in % with respect to the standard value.

In the present evaluation, three respects are important: the measurement dispersion is within ±0.1 pixel-which is a sensing resolution of the CCD camera 24; the range of the light intensity is broad while the average value of the measured data is in a range of ±0.1 pixel; and the measurement accuracy is stable within ±0.1 pixel regardless of the type of the substrate.

For the measuring condition which satisfies these requirements, when the chamber surface is treated, the accuracy is found to be stable (compare the bare surface with the processed surface in each drawing). Moreover, for the COG and halftone masks, in comparison of FIGS. 10A and 10C with FIGS. 11A and 11C, the masks of FIGS. 10A and 10C (condition of light→dark) are found to have better accuracy, broad light amount range in which the accuracy can be secured, and further little change of the average value by the light intensity. With the special purpose mask, the mask of FIG. 11B (dark→light) tends to be rather better than that of FIG. 10B (light→dark) in the above-described judgment condition. Even on the condition on which the COG mask is equivalent to the halftone mask (FIG. 10B), the light intensity range in which the accuracy can be secured becomes slightly narrow, but the position measurement is found to be possible with the predetermined accuracy, when dimmer control is appropriately performed. Accordingly, the edge sensing condition of light→dark satisfies the requirements for the measuring conditions with respect to the COG mask, special purpose mask and halftone mask with varying degree of satisfaction.

From these results, on the edge sensing condition that the gradient is light→dark or dark→light, the difference is seen in the measurement dispersion. The condition that the gradient is light→dark is found to be a condition on which more optimum edge can be sensed. On the other hand, as a result of the comparison/evaluation by the coaxial vertical illumination and backlight illumination, in the coaxial vertical illumination, there is reflection in the COG substrate or halftone substrate of the CCD camera. Therefore, it was found, unless the measurement region is strictly limited, the measurement is impossible. Furthermore, the light amount range is remarkably narrow and it was found the measurement margin is insufficient. Moreover, in the backlight illumination, a remarkable problem occurs with the halftone mask. Since the illumination light is transmitted through the halftone mask and incident upon the CCD camera, it was found the measurement becomes unstable.

Figure 12:
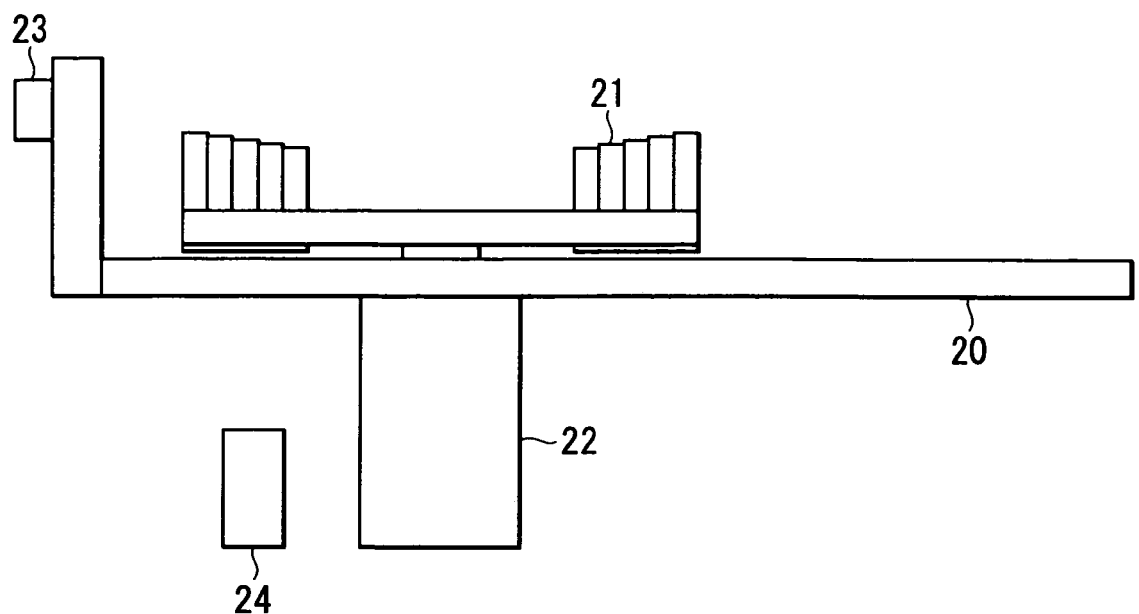
FIG. 12 is a diagram showing another configuration example of the position sensing portion of the alignment apparatus according to the present invention.

Moreover, as shown in FIG. 12, the ceiling of the chamber 20 was removed, the present apparatus was applied to a part of the transfer system in a substrate development apparatus to perform the alignment, and the accuracy of the position sensing was similarly evaluated. Furthermore, the generated dust was inspected as another evaluation.

For the evaluation concerning the accuracy of the alignment, the measurement in the atmosphere (additionally, under atmosphere management by a chemical filter) was performed in two examples of the lighting condition by a usual clean room in the back surface of the CCD camera and of non-lighting condition in a development apparatus main body. As a result, on the non-lighting condition, for example, with respect to the COG mask, the light intensity range in which the measurement is possible with the appropriate accuracy increased by about 20%. Moreover, concerning the influence by the substrate type, it has been confirmed that a satisfactory result can be obtained substantially without a significant difference.

On the lighting condition of a clean room, the measurement was unstable with respect to the halftone mask. On this condition, however, the dust inspection of the substrate surface revealed the generated dust amount is within the range which fully meets the specification, by application of this embodiment which aligns the substrate without rubbing, and the particle amount was reduced to about one-tenth of the conventional case. These remaining particles were in the same level as in the background of the developer. Therefore, the amount of the dust generated in the alignment operation is supposed to be extremely near zero.

From the above-described experiment result, it has been verified that in the alignment operation with the use of the position measuring method in the present invention, high-accuracy position sensing is performed regardless of the type of substrate without generating dust. Especially when the image for use in the edge sensing is acquired from the back surface, high-accuracy measurement is found to be possible without being influenced by the opaque film and halftone film formed on the substrate surface or the formed state of the photosensitive resist or the edge cut of the substrate peripheral portion of the resist in the surface which has heretofore raised a problem.

Moreover, it has been confirmed that measurement is possible without being influenced by the opaque film turned and formed on the substrate side surface or the chamfered edge. Furthermore, it has been found that with the use of the position measuring method by the configuration of the present invention, even the position of the transparent glass substrate can be sensed with the predetermined accuracy without any measurement error by the transmission of the measuring light as in a laser measuring apparatus or without any error by the measurement error or instability of a reflected amount of the light.

(Modification Example)

It is to be noted that the present invention is not limited to the above-described respective embodiments. It is also possible to appropriately combine and apply the first to fourth embodiments. For the process flow in the alignment operation, a combination of the flows shown in FIGS. 4 to 9 is also possible. Furthermore, a process flow in which the respective steps are appropriately changed, added, or deleted is also possible. For example, it is also possible to perform a process in which the same measuring step as S3 is disposed again as an additional step between S4 and S5 in the flow of FIG. 4.

Moreover, in FIG. 3, the bottom surface of the mask substrate 30 and the emission center of the illumination tool 23 are disposed substantially on the same plane. However, even when the surface and center are not necessarily on the same plane, the present invention sufficiently functions. For example, even when the height shifts by about five times the substrate thickness, even with the shift of the illumination light in the height direction in the range in which the edge scattered light is generated, or even with the inclination in the center direction of the emitted light, the high-quality edge image is formed by the configuration of the present sensing circuit. Therefore, the high-accuracy measurement is possible.

The lighting region is not especially defined, but it is preferable to light a plane which is parallel to the longitudinal direction of the substrate with a finite size. As in the present embodiment, a diffusion plate is preferably attached to the LED illumination tool which has a relatively small lighting unevenness. However, it is also possible to use a halogen light with a fiber optic cable using a light guide. Additionally, with the light guide, momentary ON/OFF illumination as in the LED illumination is impossible. Therefore, a waiting time is required until the light amount is stabilized after the lighting-on. Moreover, the light guide also has a problem of a temperature rise by the illumination. Therefore, during the application, it is necessary to dispose a cooling function around the illumination tool. Needless to say, even the LED illumination may preferably have the cooling function from a viewpoint of life.

Figures 13A, 13B:
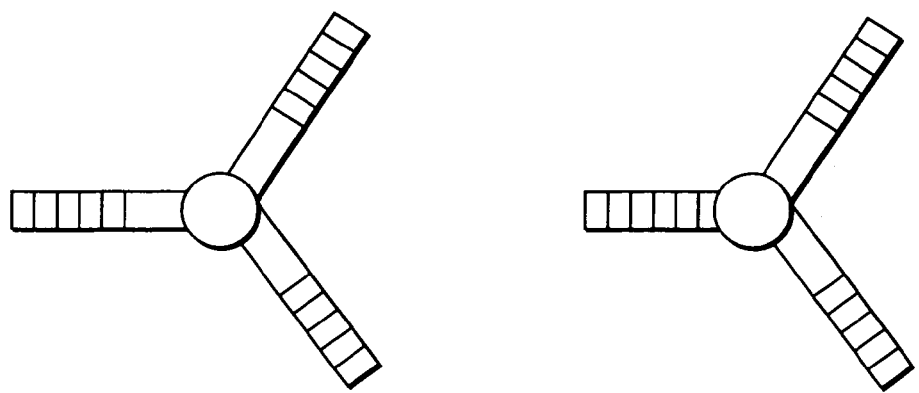
FIGS. 13A and 13B are diagrams showing another shape example of a holding portion of the substrate.

For a structure of the substrate holding portion, as shown in FIGS. 13A and 13B, various shapes can be applied. Additionally, it is important to determine the shape in a range which does not interfere with the lighting region, sensing region, and transfer system. For example, in the stage connected to the rotation mechanism by disposing the substrate holding portion on a disc-shaped plate, a glass member is disposed in a part of the disc, and a structure is configured so that the sensing region can be secured. Then, the structure can be used.

Figure 14:
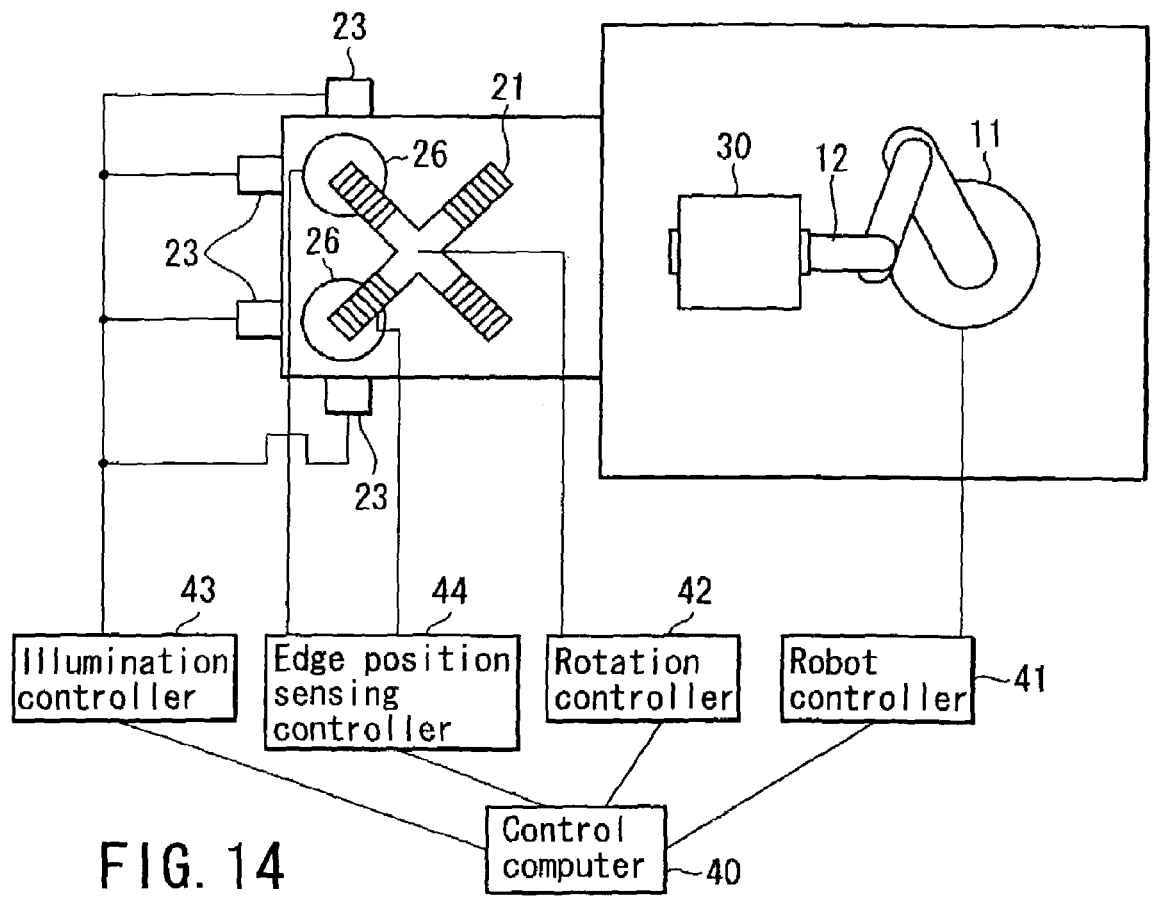
FIG. 14 is a schematic configuration diagram of a modification of the alignment apparatus for substrates according to the present invention.
Figure 15:
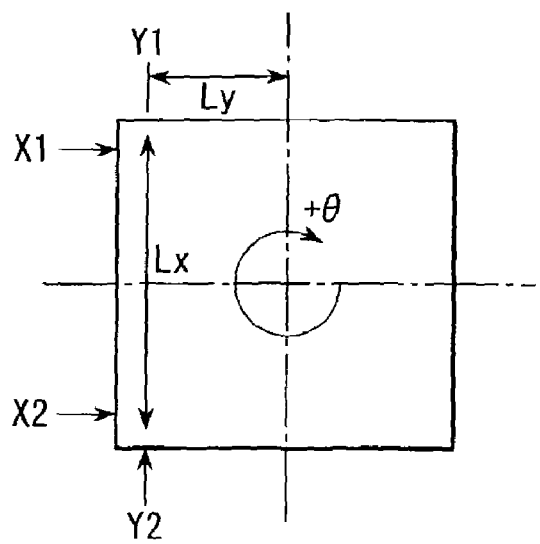
FIG. 15 is a diagram showing a coordinate system of the rotational stage in the modification of FIG. 14.

Moreover, edge measuring positions of the substrate do not necessarily have to be three. As shown in FIGS. 14 and 15, the components of the present apparatus shown in FIG. 1 are partially changed, and four edge measuring positions (X1, X2, Y1, Y2) are disposed, so that size measurement is possible. In this case, the substrate thickness can be judged by detecting the size of the substrate being transferred by the process flow of FIG. 7. Therefore, even when the substrate size is unclear, it is possible to perform an appropriate alignment process.

Furthermore, in the embodiments, two CCD cameras are used in the edge sensing sensor to measure the edges of the X, Y directions based on the plane information from the back surface of the substrate. However, it is not necessary to limit the number of cameras to two. Even when a two-dimensional sensor is not used, a plurality of CCD linear image sensors are used, and thereby a measuring function equivalent to that of the present invention can be realized. A CMOS image sensor can also be used. Additionally, the substrate size may also be measured by another sensor disposed in the course of the transfer beforehand, input to the control computer 40, and processed. For example, the thickness of the substrate is directly measured by another measuring unit disposed in a substrate stocker beforehand, and the thickness information can also be input to the control computer 40 and processed.

In the embodiment, the Cr glass mask for use as a mainstream in the original plate of a circuit pattern is used as the substrate to be treated, but it is possible to use the halftone mask or a mask whose mother material is calcium fluoride. Moreover, the present embodiments are applied to the mask substrate which has a rectangular shape, but can also be applied to a circular or rectangular substrate.

Moreover, the transfer system in the writing tool has been described as the example. As shown in FIG. 12, the present invention can also appropriately be modified, if necessary, for the application to another semiconductor manufacturing apparatus or process manufacturing apparatuses such as an ion implantation apparatus and coating and developing apparatus. Moreover, when the alignment apparatus including the configuration of the present example is applied in a vacuum sealed container as represented by the transfer system in the writing tool, the constituting components are disposed outside the vacuum container. Therefore, there is an advantage that maintenance or adjustment is facilitated. Needless to say, the substrate is not limited to the mask substrate. In the transfer system or apparatus in which the alignment is required, the substrate can also be applied to a display device such as a liquid crystal panel.

As described above in detail, according to the present invention, the transfer robot, rotational stage, position sensing sensor, and control computer can be used to position the substrate without rubbing the substrate as in the related art. Thereby, the generated dust or damage can be reduced, and further the illumination is performed from the substrate side surface direction to sense the position, so that accurate alignment can be realized regardless of the material or size of the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An alignment method for a substrate, comprising:
   providing an alignment apparatus including:
      a movement mechanism configured to move the substrate in a horizontal direction and in a vertical direction,
      a rotation mechanism configured to rotate the substrate in a horizontal plane,
      an illumination tool configured to irradiate the substrate with an illumination light,
      an image sensor configured to pick up an image of the substrate,
      an edge position sensor configured to sense a plurality of edge positions of the substrate, and
      a computer;
   transferring the substrate from a previous stage using the first movement mechanism;
   measuring a position of the substrate by picking up an image on a back surface of the substrate using the image sensor while irradiating the substrate with the illumination light from a sidewise direction;
   calculating positional shifts regarding X, Y, and θ using the edge position sensor and the computer;
   correcting the positional shifts of X and Y by the movement mechanism;
   mounting the substrate on a rotational stage;
   correcting the positional shift of θ by the rotation mechanism; and
   transferring the substrate to a next stage.

2. The alignment method according to claim 1, wherein said irradiating the substrate includes emitting the illumination light substantially in parallel with front and back surfaces of the substrate, the illumination light having a spread of the vertical direction that is not less than a thickness of the substrate.

3. The alignment method according to claim 2, wherein the illumination light is a white light.

4. The alignment method according to claim 2, wherein the illumination light has the spread of 40 degrees or less.

5. The alignment method according to claim 1, wherein said irradiating the substrate includes changing a light amount of the illumination light in a phased manner by the illumination tool, and said measuring a position of the substrate includes picking up the image for each phase by the image sensor.

6. The alignment method according to claim 1, wherein said measuring a position of the substrate includes sensing a scattered light in a side surface including a corner of the substrate by the image sensor.

7. The alignment method according to claim 1, wherein said transferring the substrate from a previous stage includes transferring a transparent substrate selected from the group consisting of a blank mask substrate and a mask substrate including a pattern formed on a front surface thereof.

8. The alignment method according to claim 1, wherein said calculating positional shifts regarding X, Y, and θ includes judging by the computer whether or not a measurement accuracy and measured value are within a predetermined allowable range with respect to a sensed result of the edge position.

9. The alignment method according to claim 1, further comprising moving the substrate into a chamber that includes the rotation mechanism, the chamber having a wall surface configured to diffuse the illumination light.

10. The alignment method according to claim 1, wherein said providing an alignment apparatus includes providing a robot as the movement mechanism, the robot configured to transfer the substrate.

11. An alignment method for a substrate, comprising:
    providing an alignment apparatus including:
       a transfer robot including an end effecter, the end effecter configured to mount the substrate thereon and to be driven in a direction of a horizontal plane and a vertical direction,
       an end effecter position sensor configured to sense a position in the horizontal plane and the vertical direction of the end effecter,
       a stage configured to mount the substrate thereon and to be rotatable,
       an illumination tool configured to irradiate the substrate mounted on the end effecter with an illumination light,
       an image sensor configured to sense an image of the substrate,
       an edge position sensor configured to sense edge positions of a plurality of portions of the substrate from the sensed image, and
       a computer;
    transferring the substrate to a predetermined position in the horizontal plane by the transfer robot;
    positioning the end effecter at a reference height in accordance with a thickness of the substrate;
    measuring a position of the substrate by picking up an image on a back surface of the substrate by the image sensor while irradiating the substrate with the illumination light from a sidewise direction;
    calculating a relative positional shift between the substrate and the end effecter by the edge position sensor and the end effecter position sensor;
    correcting the positional shift of the substrate in the horizontal plane by the transfer robot based on a calculation result;

mounting the substrate having the positional shift corrected on the stage such that the substrate is centered on the stage; and correcting the positional shift of the substrate in a rotation direction by the stage.

12. The alignment method according to claim 11, wherein said providing an alignment apparatus includes providing the transfer robot including an end effecter having a staircase-shaped step surface in accordance with a size of the substrate, the end effecter configured to mount the substrate in parallel with a horizontal operation surface of the transfer robot.

13. The alignment method according to claim 11, wherein said providing an alignment apparatus includes providing the end effecter position sensor including an encoder.

14. The alignment method according to claim 11, wherein said calculating a relative positional shift includes sensing three edge positions of at least two sides, having different directions, of the substrate mounted on the end effecter by the edge position sensor.

15. The alignment method according to claim 11, wherein said irradiating the substrate includes emitting the illumination light substantially in parallel with front and back surfaces of the substrate by the illumination tool, the illumination light having a spread of the vertical direction that is not less than a thickness of the substrate.

16. The alignment method according to claim 15, wherein the illumination light is a white light.

17. The alignment method according to claim 15, wherein the illumination light has the spread of 40 degrees or less.

18. The alignment method according to claim 11, wherein said irradiating the substrate includes changing a light amount of the illumination light in a phased manner by the illumination tool, and said measuring a position of the substrate includes picking up the image for each phase by the image sensor.

19. The alignment method according to claim 11, wherein said measuring a position of the substrate includes sensing a scattered light from a side surface including a corner of the substrate by the image sensor.

20. The alignment method according to claim 11, wherein said transferring the substrate includes transferring a transparent substrate selected from the group consisting of a blank mask substrate and a mask substrate including a pattern formed on a front surface thereof.

* * * * *